United States Patent
Chang et al.

(10) Patent No.: US 7,190,173 B2
(45) Date of Patent: Mar. 13, 2007

(54) IMPEDANCE CALIBRATION CIRCUIT AND METHOD THEREOF

(75) Inventors: Chia-Jun Chang, Taipei (TW); Tzung-Ming Chen, Taipei (TW)

(73) Assignee: Realtek Semiconductor Corp., HsinChu (TW)

( * ) Notice: Subject to any disclaimer, the term of this patent is extended or adjusted under 35 U.S.C. 154(b) by 0 days.

(21) Appl. No.: 10/908,817

(22) Filed: May 27, 2005

(65) Prior Publication Data
US 2005/0264300 A1 Dec. 1, 2005

(30) Foreign Application Priority Data
May 31, 2004 (TW) ............................. 93115484 A

(51) Int. Cl.
*G01R 35/00* (2006.01)
(52) U.S. Cl. ..................................... 324/601
(58) Field of Classification Search ................ 324/601
See application file for complete search history.

(56) References Cited

U.S. PATENT DOCUMENTS 6,765,377 B1 *  7/2004  Lu ........................... 324/123 R
6,946,848 B2 *  9/2005  Tauber et al. ............... 324/601

* cited by examiner

*Primary Examiner*—Andrew H. Hirshfeld
*Assistant Examiner*—Timothy J. Dole
(74) *Attorney, Agent, or Firm*—Winston Hsu

(57) ABSTRACT

The present invention discloses an impedance calibration circuit and method for calibrating an equivalent impedance of a semiconductor circuit element. The disclosed impedance calibration circuit includes a reference circuit, a second circuit element, and a controlling circuit. The reference circuit receives a test signal and outputs a first signal. The second circuit element is coupled to the semiconductor circuit element to form a test circuit and receives the test signal and outputs a second signal. The controlling circuit is coupled to the reference circuit and the test circuit for comparing the first signal with the second signal and adjusting the equivalent impedance of the semiconductor circuit element accordingly.

19 Claims, 3 Drawing Sheets

IMPEDANCE CALIBRATION CIRCUIT AND METHOD THEREOF

BACKGROUND OF THE INVENTION

1. Field of the Invention

The present invention relates to impedance calibration, and more particularly, to an impedance calibration circuit used for calibrating an equivalent impedance of a semiconductor circuit element and method thereof.

2. Description of the Prior Art

Resistors are probably one of the most frequently used circuit elements in every kind of electronic devices. There are many types of resistors that can be selected when designing a discrete circuit. However, since passive resistors, such as metal or poly-silicon line resistors, occupy much area on an integrated circuit (abbreviated as IC), designers tend to use active elements to substitute for passive resistors when designing ICs, where a substitute active element has an equivalent impedance being substantially equal to that of a replaced passive resistor.

However, the characteristics of active elements are not only affected by manufacturing process variations, but the fluctuation of environmental parameters (such as temperature fluctuations) also changes the characteristics of active elements greatly. For example, when temperature changes, the equivalent impedance of an active element also changes accordingly. Under this situation the performance of an IC that comprises the active element would sometimes degrade considerably.

SUMMARY OF THE INVENTION

It is therefore an objective of the present invention to provide an impedance calibration circuit and method for calibrating an equivalent impedance of an active element.

According to embodiments of the present invention, an impedance calibration circuit is disclosed for calibrating an equivalent impedance of a semiconductor circuit element. The disclosed impedance calibration circuit includes a reference circuit, a second element, and a control circuit. The reference circuit includes a reference element and a first element and receives a test signal and outputs a first signal. The second element is coupled to the semiconductor circuit element, where the semiconductor circuit element and the second element form a test circuit. The test circuit receives the test signal and outputs a second signal. The control circuit is coupled to the reference circuit and the test circuit and compares the first signal with the second signal and calibrates the equivalent impedance of the semiconductor circuit element accordingly.

According to embodiments of the present invention, a method for using an impedance calibration circuit to calibrate an equivalent impedance of a semiconductor circuit element is also disclosed. The impedance calibration circuit includes a reference circuit and a test circuit. The test circuit has the semiconductor circuit element. The disclosed method includes the following steps. Input a test signal to the reference circuit and the test circuit. Compare a first signal outputted by the reference circuit with a second signal outputted by the test circuit. Calibrate the equivalent impedance of the semiconductor circuit element according to the comparing result.

According to embodiments of the present invention, a method for calibrating an equivalent impedance of a semiconductor circuit element is further disclosed. The method comprises providing a reference circuit; providing a test circuit comprising the semiconductor circuit element; feeding a test signal to the reference circuit; outputting a first signal from the reference circuit in response to the feeding of the test signal to the reference circuit; feeding the test signal to the test circuit; outputting a second signal from the test circuit in response to the feeding of the test signal to the test circuit; comparing the first signal and the second signal; and adjusting the equivalent impedance of the semiconductor circuit element according to the comparing result.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
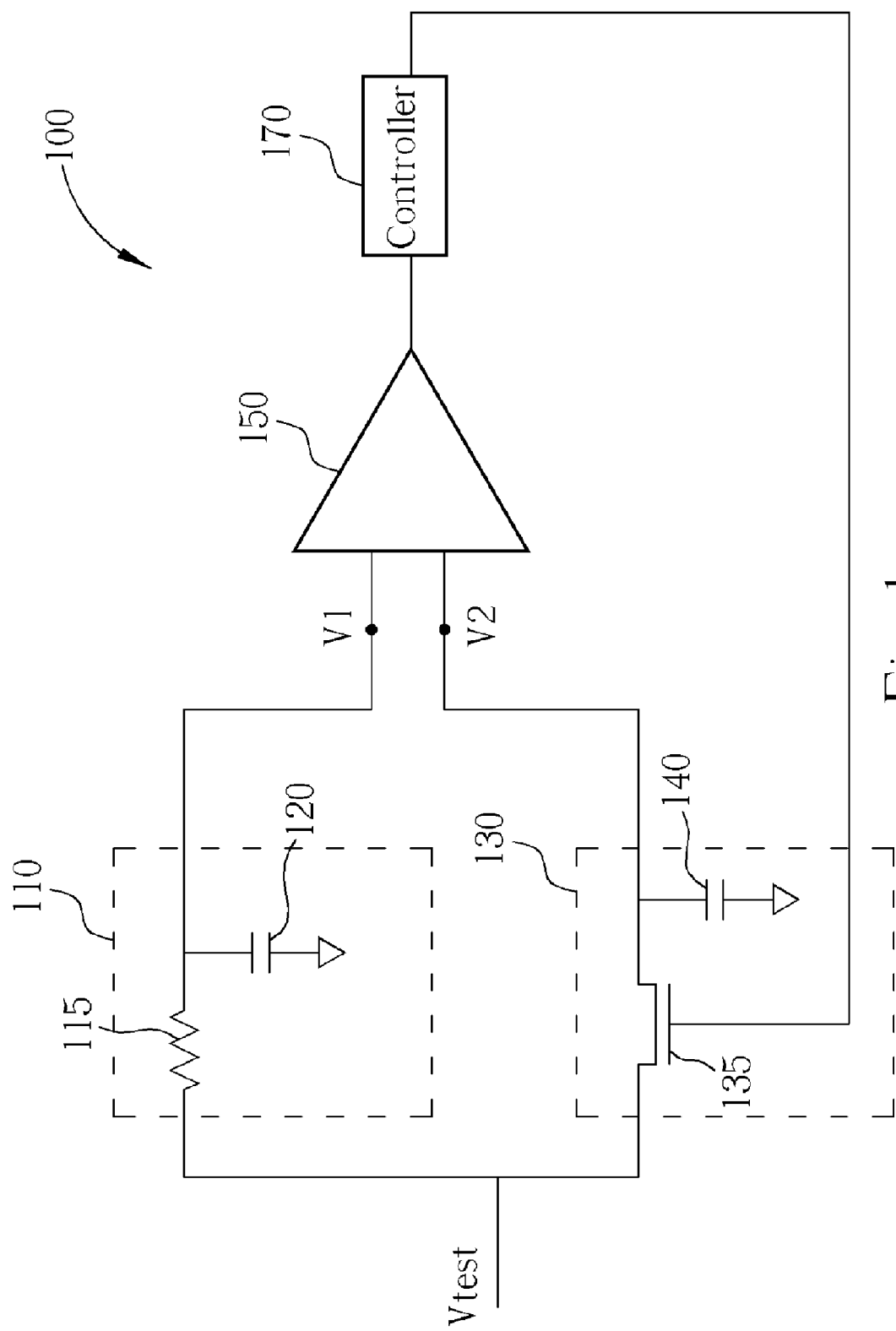
FIG. 1 shows an impedance calibration circuit according to an embodiment of the present invention.

FIG. 1 shows an impedance calibration circuit 100 according to a first embodiment of the present invention. The impedance calibration circuit 100 shown in this figure is for calibrating an equivalent impedance of a semiconductor circuit element 135, where the semiconductor circuit element 135 in this example is a MOS transistor. The impedance calibration circuit 100 includes a reference circuit 110 (formed by a reference element 115 and a first capacitor 120), a second capacitor 140, a comparator 150, and a controller 170, where the semiconductor circuit element 135 and the second capacitor 140 form a test circuit 130. It is well understood by those of ordinary skill in the art, during semiconductor manufacturing process, it is easier to accurately control the parameters of a semiconductor capacitor than resistor. Hence in this embodiment, the first capacitor 120 is designed to have a capacitance that is the same as that of the second capacitor 140.

To calibrate the equivalent impedance of the semiconductor circuit element 135, a test signal Vtest of certain predefined waveform is first inputted to the reference circuit 110 and the test circuit 130. Depending on the characteristics of the reference circuit 110 and the test circuit 130—where in this embodiment both of these two circuits are of low pass filtering characteristics—a first signal V1 and a second signal V2 will be generated by these two circuits respectively. Assuming that the goal of such calibrating is to have an equivalent impedance of the semiconductor circuit element 135 equal to that of the reference element 115, the first signal V1 outputted by the reference circuit 110 should be of the same waveform transient as the second signal V2 outputted by the test circuit 130.

However, since the inaccuracies of the semiconductor manufacturing process and the fluctuations of environmental parameters may alter the equivalent impedance of the semiconductor circuit element 135 to be different than that of the reference element 115, the transient of the first signal V1 outputted by the reference circuit 110 might be different than that of the second signal V2 outputted by the test circuit 130. Under this situation the comparator 150 will detect the difference between the transients of the first signal V1 and the second signal V2, and the controller 170 will, according to the result of the comparison, adjust the control voltage altering the equivalent impedance of the semiconductor circuit element 135 until the transient of first signal V1 matches that of the second signal V2. Please note that in this embodiment the controller 170 calibrates the equivalent impedance of the semiconductor circuit element 135 by controlling the voltage level at a gate of the semiconductor circuit element 135. After the calibration process is finished, the equivalent impedance of the semiconductor circuit element 135 will be the same as that of the reference element 115.

Although in this embodiment the first capacitor 120 is designed to have a capacitance equal to that of the second capacitor 140, a proportional relationship can also be designed between the capacitances of the first capacitor 120 and the second capacitor 140. Since the transient wave shapes of the first signal V1 and the second signal V2 depend on the RC low pass characteristics of the reference circuit 110 and the test circuit 130 respectively, it is still practicable for the comparator 150 and the controller 170 to calibrate the equivalent impedance of the semiconductor circuit element 135 taking into account the proportional relationship existing between the capacitances of the first capacitor 120 and the second capacitor 140.

Furthermore, a plurality of switches could be used to disconnect the semiconductor circuit element 135 from the impedance calibration circuit 100 and connect the semiconductor circuit element 135 back to an original position in an actual circuit after the calibration process finishes, serving its intended purpose. If there is more than one semiconductor circuit element 135 used in an integrated circuit to provide similar impedance characteristics, only one impedance calibration circuit 100 and properly designed switches will be enough to calibrate the equivalent impedances of all the semiconductor circuit elements 135. Hence complexity of the overall circuit could be reduced.

Figure 2:
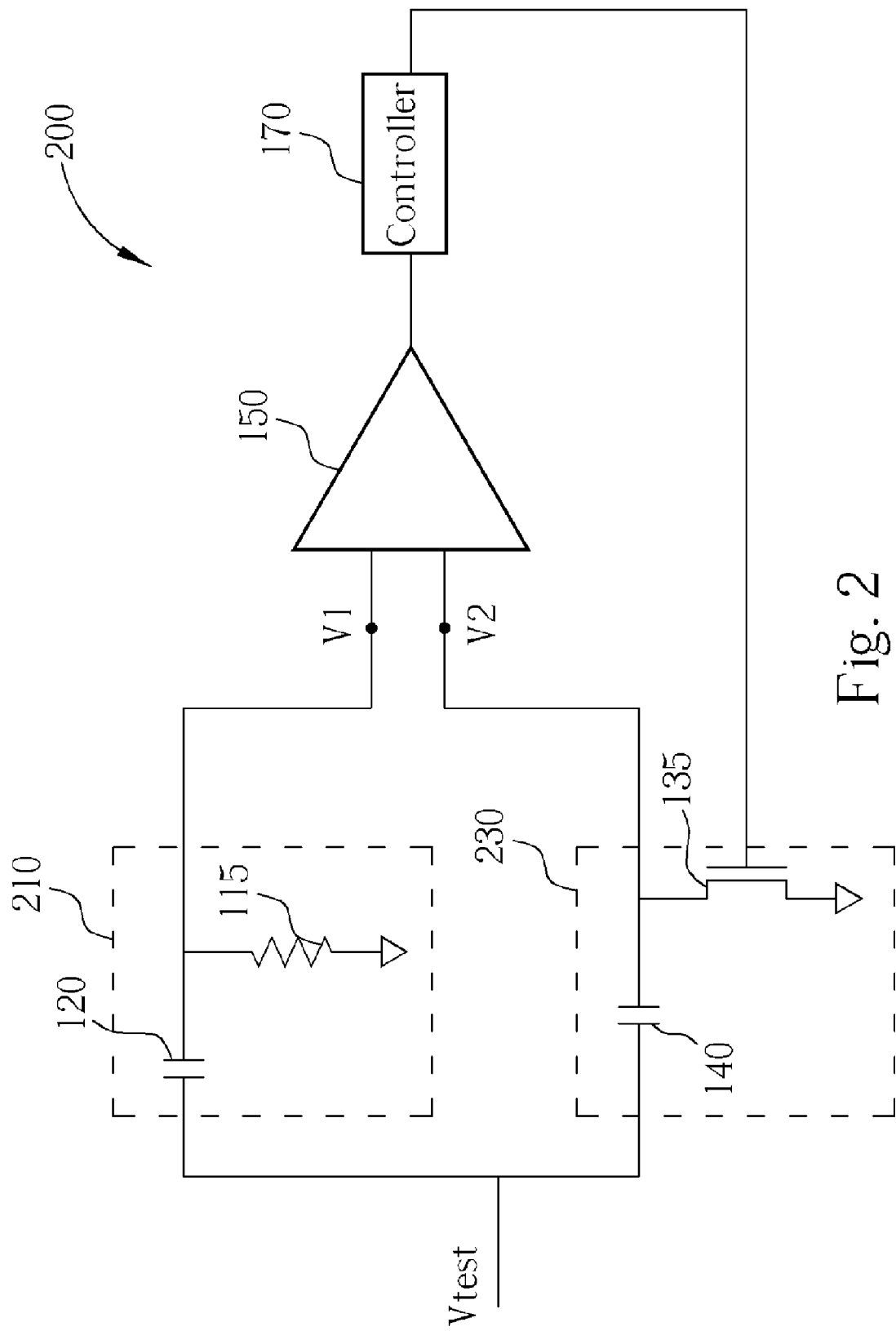
FIG. 2 shows an impedance calibration circuit according to another embodiment of the present invention.

In the first embodiment mentioned-above, both the reference circuit 110 and the test circuit 130 are equivalent to low pass filters. However, in other embodiments of the present invention, the reference circuit and the test circuit could also be designed to form other types of circuit structures, with a high pass filter merely being one of the examples. FIG. 2 shows an impedance calibration circuit 200 according to a second embodiment of the present invention. In the impedance calibration circuit 200 shown in FIG. 2, both the reference circuit 210 and the test circuit 230 are of high pass filtering characteristics. The basic idea of the circuit shown in FIG. 2 is similar to the circuit shown in FIG. 1, hence further explanation will be omitted herein. Still, if there is more than one semiconductor circuit element 135 used in an integrated circuit to provide similar impedance characteristics, only the one impedance calibration circuit 200 shown in FIG. 2 and properly designed switches will be enough to calibrate the equivalent impedances of all the semiconductor circuit elements 135.

Although only filters formed by resistors and capacitors are used as examples of the test circuit and the reference circuit, other kinds of circuits formed by active and/or passive element(s) can also be used as the test circuit and the reference circuit, as long as the comparator can detect the difference between the signals, either dynamic transient or static state thereof, outputted by the reference circuit and the test circuit, and the controller can calibrate the equivalent impedance of the semiconductor circuit element correctly according to the comparing result of the comparator.

Figure 3:
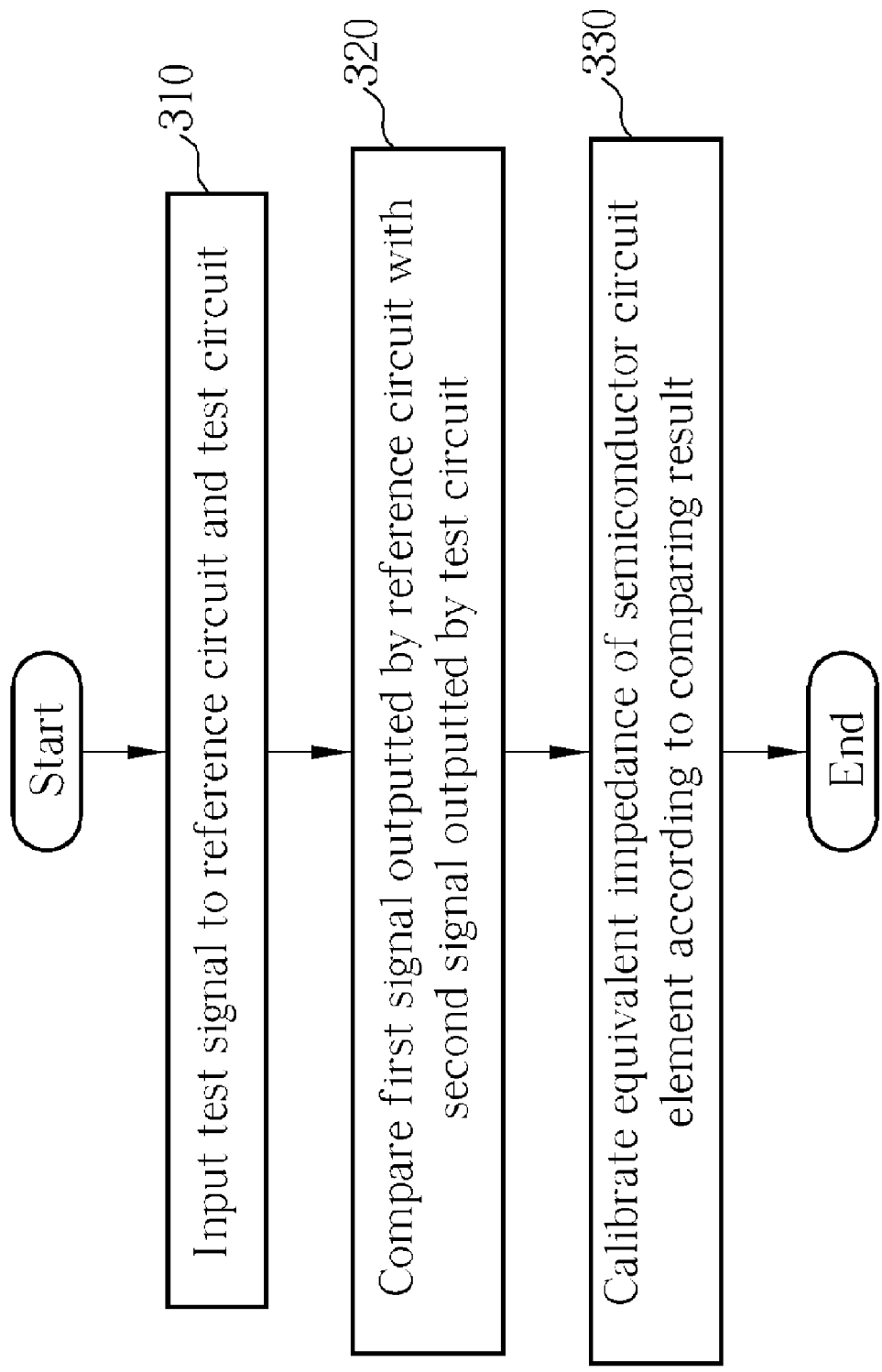
FIG. 3 shows a flow chart of an equivalent impedance calibration method according to an embodiment of the present invention.

FIG. 3 shows an equivalent impedance calibration method according to an embodiment of the present invention. The flowchart shown in FIG. 3 could be applied with the circuit structure shown in FIG. 1 or FIG. 2. However, this does not limit the scope of the present invention. The flowchart shown in FIG. 3 contains the following steps.

Step 310: Input a test signal to the reference circuit and the test circuit.

Step 320: Compare a first signal outputted by the reference circuit with a second signal outputted by the test circuit.

Step 330: Calibrate the equivalent impedance of the semiconductor circuit element according to the comparing result. More specifically, when the dynamic transient of the second signal is different than that of the first signal, or in another case, the static states of the signals are different, adjust the equivalent impedance of the semiconductor circuit element until the second signal approaches the first signal.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An impedance calibration circuit for calibrating an equivalent impedance of a semiconductor circuit element, the impedance calibration circuit comprising:
   a reference circuit comprising a reference element and a first element, for receiving a test signal and outputting a first signal;
   a second element coupled to the semiconductor circuit element, wherein the semiconductor circuit element and the second element form a test circuit, and the test circuit receives the test signal and outputs a second signal; and
   a control circuit coupled to the reference circuit and the test circuit for comparing the first signal with the second signal to detect waveform transient difference between the first and second signals, and calibrating the equivalent impedance of the semiconductor circuit element according to the comparison result of the wave transients;
   wherein the first and second elements are capacitors.

2. The impedance calibration circuit of claim 1 wherein the impedance of the first element is substantially the same as that of the second element.

3. The impedance calibration circuit of claim 1 wherein the impedance of the first element is proportional to that of the second element.

4. The impedance calibration circuit of claim 1 wherein the control circuit comprises:
   a comparator coupled to the reference circuit and the test circuit for comparing the first signal with the second signal; and
   a controller coupled to the comparator and the semiconductor circuit element for calibrating the equivalent impedance of the semiconductor circuit element according to a comparing result of the comparator.

5. The impedance calibration circuit of claim 1 wherein the semiconductor circuit element comprises a MOS transistor.

6. The impedance calibration circuit of claim 1 wherein the reference element is a resistor.

7. An impedance calibration circuit for calibrating an equivalent impedance of a semiconductor circuit element, the impedance calibration circuit comprising:

a reference circuit comprising a reference element and a first element, for receiving a test signal and outputting a first signal;

a second element coupled to the semiconductor circuit element, wherein the semiconductor circuit element and the second clement form a test circuit, and the test circuit receives the test signal and outputs a second signal; and a control circuit coupled to the reference circuit and the test circuit for comparing the first signal with the second signal to detect waveform transient difference between the first and second signals, and calibrating the equivalent impedance of the semiconductor circuit element according to the comparison result of the wave transients;

wherein the reference circuit is a first filter, and the test circuit is a second filter.

8. The impedance calibration circuit of claim 7 wherein the first and second filters are low pass filters.

9. The impedance calibration circuit of claim 7 wherein the first and second filters are high pass filters.

10. A method for calibrating an equivalent impedance of a semiconductor circuit element, the method comprising:
    providing a reference circuit;
    providing a test circuit comprising the semiconductor circuit element, wherein the test circuit comprises a capacitor;
    feeding a test signal to the reference circuit, wherein the test signal is of a predefined waveform;
    outputting a first signal from the reference circuit in response to the feeding of the test signal to the reference circuit;
    feeding the test signal to the test circuit;
    outputting a second signal from the test circuit in response to the feeding of the test signal to the test circuit;
    comparing the first signal and the second signal; and
    adjusting the equivalent impedance of the semiconductor circuit element according to the comparing result.

11. The method of claim 10, wherein the semiconductor circuit element comprises a MOS transistor.

12. The method of claim 10, wherein the comparing step further comprising:
    comparing a transient waveform of the first signal and a transient waveform of the second signal in response to an input transient waveform of the test signal.

13. The method of claim 10, wherein the comparing step further comprising:
    comparing a static state of the first signal and a static state of the second signal in response to an input state of the test signal.

14. A method for calibrating an equivalent impedance of a semiconductor circuit element, the method comprising:
    providing a reference circuit;
    providing a test circuit comprising the semiconductor circuit element;
    feeding a test signal to the reference circuit, wherein the test signal is of a predefined waveform;
    outputting a first signal from the reference circuit in response to the feeding of the test signal to the reference circuit;
    feeding the test signal to the test circuit;
    outputting a second signal from the test circuit in response to the feeding of the test signal to the test circuit;
    comparing the first signal and the second signal; and
    adjusting the equivalent impedance of the semiconductor circuit element according to the comparing result;
wherein the reference circuit comprises a resistor and a capacitor.

15. A method for calibrating an equivalent impedance of a semiconductor circuit element, the method comprising:
    providing a reference circuit;
    providing a test circuit comprising the semiconductor circuit element;
    feeding a test signal to the reference circuit, wherein the test signal is of a predefined waveform;
    outputting a first signal from the reference circuit in response to the feeding of the test signal to the reference circuit;
    feeding the test signal to the test circuit;
    outputting a second signal from the test circuit in response to the feeding of the test signal to the test circuit;
    comparing the first signal and the second signal; and
    adjusting the equivalent impedance of the semiconductor circuit element according to the comparing result;
wherein the reference circuit and the test circuit are both of low-pass filtering characteristics.

16. A method for calibrating an equivalent impedance of a semiconductor circuit element, the method comprising:
    providing a reference circuit;
    providing a test circuit comprising the semiconductor circuit element;
    feeding a test signal to the reference circuit, wherein the test signal is of a predefined waveform;
    outputting a first signal from the reference circuit in response to the feeding of the test signal to the reference circuit;
    feeding the test signal to the test circuit;
    outputting a second signal from the test circuit in response to the feeding of the test signal to the test circuit;
    comparing the first signal and the second signal; and
    adjusting the equivalent impedance of the semiconductor circuit element according to the comparing result;
wherein the reference circuit and the test circuit are both of high-pass filtering characteristics.

17. An impedance calibration circuit for calibrating an equivalent impedance of a semiconductor circuit element, the impedance calibration circuit comprising:
    a reference circuit comprising a reference element and a first element, for receiving a test signal and outputting a first signal;
    a second element coupled to the semiconductor circuit element, wherein the semiconductor circuit element and the second element form a test circuit, and the test circuit receives the test signal and outputs a second signal; and
    a control circuit coupled to the reference circuit and the test circuit for comparing the first signal with the second signal and calibrating the equivalent impedance of the semiconductor circuit element accordingly;
wherein the reference circuit is a first filter, and the test circuit is a second filter.

18. The impedance calibration circuit of claim 17, wherein the control circuit comprises:
    a comparator coupled to the reference circuit and the test circuit for comparing the first signal with the second signal; and
    a controller coupled to the comparator and the semiconductor circuit element for calibrating the equivalent impedance of the semiconductor circuit element according to a comparing result of the comparator.

19. The impedance calibration circuit of claim 17, wherein the test circuit comprises a capacitor.

* * * * *